United States Patent

Parzen

[15] 3,660,763

[45] May 2, 1972

[54] WIDE BAND FREQUENCY EXTENDER FOR A FREQUENCY COMPARATOR

[72] Inventor: Benjamin Parzen, 303 East 57th Street, New York, N.Y. 10022

[22] Filed: Jan. 8, 1970

[21] Appl. No.: 1,472

[52] U.S. Cl. ................................325/363, 324/79, 325/430, 325/435

[51] Int. Cl. ..........................................................H04b 1/00

[58] Field of Search ..................325/363, 430, 431, 433, 434, 325/435, 67, 134; 324/79 R, 82 R, 83 A, 83 FE

[56] References Cited

UNITED STATES PATENTS 3,124,799 3/1964 Hagedorn et al....................325/435 X
3,435,344 3/1969 Blair et al...........................325/363 X
3,071,726 1/1963 Nelson....................................324/79

*Primary Examiner*—Benedict V. Safourek
*Attorney*—Sandoe, Hopgood and Calimafde

[57] ABSTRACT

An apparatus for effectively extending the operating range of a frequency comparator is described. Input signals of close frequency are heterodyned by a common variable local oscillator to produce intermediate frequency (i.f.) signals at the output of mixers. A stable reference crystal oscillator signal source having a frequency coincident with the input frequency of a frequency comparator is compared with one of the i.f. signals. An error signal representative of the comparison is applied to the variable local oscillator to alter the frequency thereof in a direction to phase lock the one i.f. signal to the reference signal source. Frequency comparisons of signals over a large frequency band is provided.

5 Claims, 1 Drawing Figure

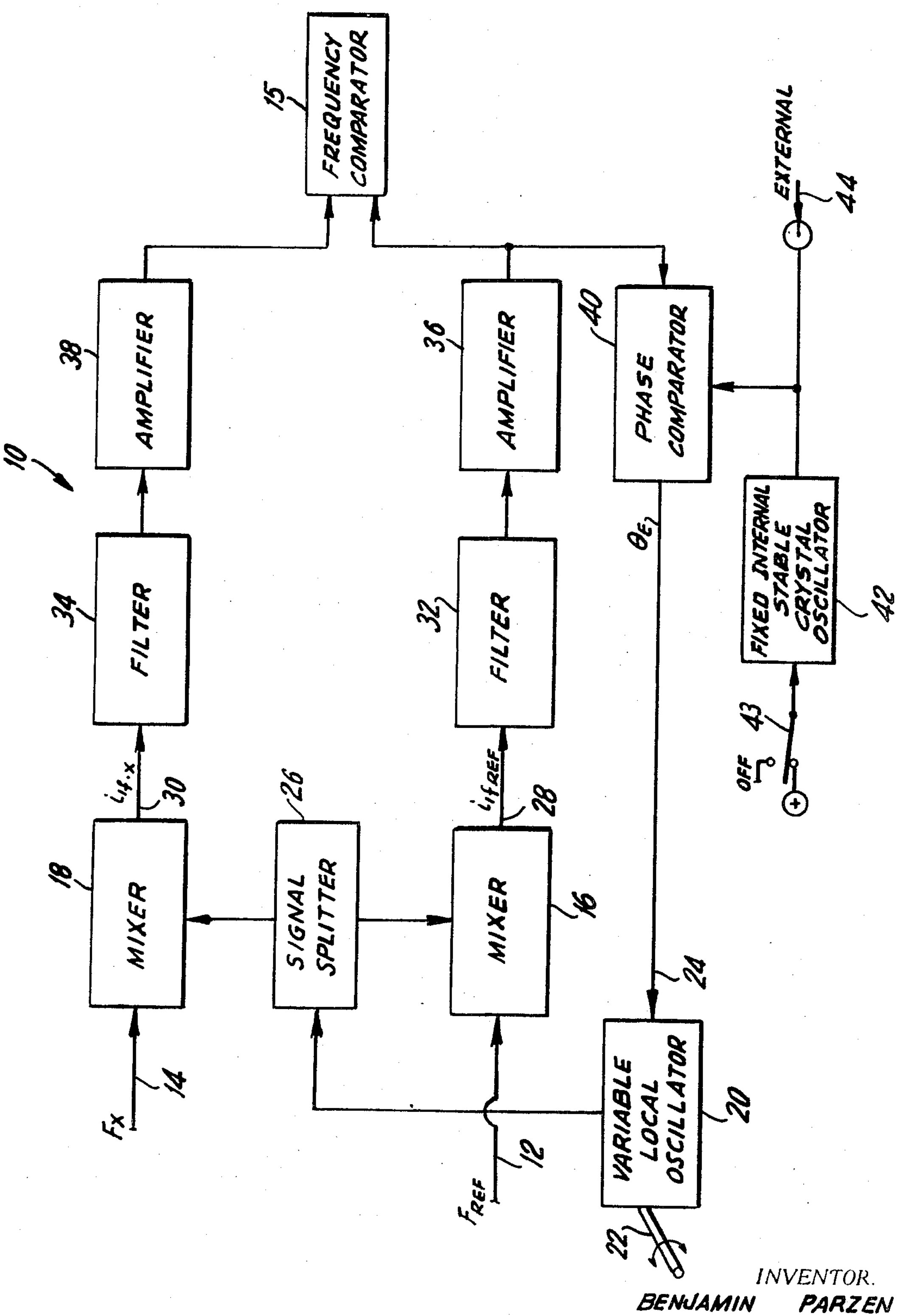
INVENTOR.
BENJAMIN PARZEN
BY
Sandoe, Hopgood & Calimafde
ATTORNEYS

WIDE BAND FREQUENCY EXTENDER FOR A FREQUENCY COMPARATOR

This invention relates to an apparatus for extending the frequency range of frequency comparators.

In a frequency comparator, signals of different frequency are compared to produce an output signal indicative of their frequency difference. Such comparators are especially useful for comparing primary frequency standards where minute frequency differences are to be accurately determined. Typically, a frequency difference of one part in $10^{10}$ or more is measured by comparing signals having a fixed selected nominal frequency of, say 1 MHz. This invention provides an apparatus whereby signals of any desired nominal frequency may be frequency compared with a comparator as just described.

In a frequency expander in accordance with the invention a pair of input signals having close but of slightly different frequencies are heterodyned with a variable frequency signal source to produce intermediate frequency (i.f.) signals which coincide with the nominal input frequency of a comparator. One of the input signals is called the reference input signal, $F_{REF}$, and the other is called the unknown input signal, $F_x$. Correspondingly, one of the i.f. signals is called the i.f.$_{REF}$ signal and the other is the i.f.$_x$ signal. The i.f.$_{REF}$ signal after suitable amplification is phase locked by comparing its phase with that of a stable fixed frequency crystal oscillator. This crystal oscillator has a frequency which coincides with the input frequency of a frequency comparator to which both i.f.$_{REF}$ and i.f.$_x$ are applied. The phase error signal obtained from the comparator is applied to an electronic frequency controlling input of the variable frequency source to alter the latter's frequency in a direction that reduces the phase error to a minimum. In this manner input signals at any desired frequency may be frequency compared, thus providing a wide frequency band of operation for the frequency comparator.

It is, therefore, an object of this invention to provide an apparatus for frequency comparing signals of any desired frequency in a simple and accurate manner.

Other objects and advantages of the invention will be understood from the following description of a preferred embodiment of the invention in conjunction with the drawing which is a schematic block diagram of a wide band frequency extender in accordance with the invention.

In the figure a wide frequency band extender 10 is illustrated with component parts indicated in block diagram form. A pair of input signals, $F_{REF}$ and $F_x$ are respectively applied on input leads 12–14 for frequency comparison by a frequency comparator 15.

Input leads 12–14 are coupled to inputs of mixers 16–18 respectively. A variable local oscillator 20 having a mechanical frequency varying input 22 and an electronic frequency varying input 24 is provided. The local oscillator signal is coupled to a signal splitter 26, such as a hybrid network, to provide the same frequency input to mixers 16–18. Each mixer then produces at its output 28–30 respectively i.f. signals i.f.$_{REF}$ and i.f.$_x$. The i.f. signals are the frequency difference between the mixer inputs.

Both i.f. signals are then each passed through a band pass filter such as 32–34 and an i.f. amplifier such as 36–38. The output of amplifiers 36–38 are coupled to the inputs of frequency comparator 15. Filters 32–34 have center pass band frequencies which substantially coincide with the nominal input frequency of comparator 15.

The amplified i.f.$_x$ signal is then applied to a phase comparator 40 such as a synchronous detector where i.f.$_x$ is phase compared with the reference signal output from a highly stable internal frequency source 42 such as a crystal oscillator. Alternatively an external stable frequency source as applied to line 44 may be used for phase comparison. In the latter alternate situation oscillator source 42 is disabled by removing its voltage power source with switch 43.

The frequency of the source 42 or that applied externally to line 44 is selected to coincide with the input signal frequency of frequency comparator 15 so that both i.f.$_{REF}$ and i.f.$_x$ may be frequency aligned with that of comparator 15.

Frequency alignment of i.f. and i.f.$_x$ is accomplished by coupling the phase error signal $\theta_E$ on the output of phase comparator 40 to the electronic frequency varying input 24 of local oscillator source 20. The polarity and magnitude of $\theta_E$ are selected to alter the frequency of source 20 in a direction that brings i.f.$_{REF}$ substantially in phase with local oscillator 42.

In effect i.f.$_{REF}$ is thus phase and frequency locked to the input frequency of frequency comparator 15. The frequency difference thus measured by the comparator 15 is the frequency difference between $F_{REF}$ and $F_x$.

Such frequency comparison may then be effectively extended to include input signal frequencies of any desired value. A frequency extender built in accordance with this invention effectively extended the frequency operation of a frequency comparator having a 1 MHz input frequency from 1 MHz to 108 MHz, i.e. a frequency band of the order of 1 to 100.

Having thus described an embodiment of a frequency extender for use with a frequency comparator its many advantages in economy, ease of operation and versatality may be understood.

What is claimed is:

1. An apparatus for comparing the frequency difference between first and second input signals of close frequency with a frequency comparator having an invariable input frequency comprising
   - first and second mixing means coupled to said variable frequency source and respectively receiving said first and second input signals for heterodyning said first and second input signals with the output of said variable frequency source for producing first and second intermediate frequency signals respectively representative of the frequency difference between the output of said variable frequency source and said first and second input signals;
   - a stable reference frequency source having a frequency coincident with the input frequency of said frequency comparator;
   - phase comparing means coupled to said stable frequency source and one of said mixing means for producing an error signal representative of the deviation in frequency of one of said intermediate frequency signals at the output of said one of said mixing means and the output signal of said stable frequency source, said error signal being applied to the frequency control terminal of said variable frequency source to vary the frequency of the latter in a sense to maintain the frequency of said one intermediate frequency signal coincident with the invariable input frequency of said frequency comparator.

2. The frequency extender apparatus as claimed in claim 1 wherein said error signal producing means comprises a synchronous phase detector for phase locking said variable frequency source and said stable reference frequency source.

3. The frequency extender as claimed in claim 2 and further including
   - first and second filtering means respectively coupled intermediate the input of said frequency comparator and the output of said first and second mixing means and having a frequency pass band centered about the input frequency of said frequency comparator.

4. The frequency extender apparatus as claimed in claim 3, and further including a signal splitter interposed between said variable frequency source and said first and second mixing means.

5. The frequency extender apparatus as claimed in claim 1 wherein said variable frequency source is variable over a frequency range of the order of 100 to 1 to provide a corresponding frequency extension of said frequency comparator.

* * * * *